(12) United States Patent
Finocchiaro

(10) Patent No.: US 8,044,712 B2
(45) Date of Patent: Oct. 25, 2011

(54) CIRCUIT AND METHOD FOR IMPROVED FREQUENCY RESOLUTION OF WIDE-BANDWIDTH DIGITALLY PROGRAMMABLE RC ACTIVE FILTERS

(75) Inventor: Salvatore Finocchiaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 227 days.

(21) Appl. No.: 12/287,853

(22) Filed: Oct. 14, 2008

(65) Prior Publication Data

US 2010/0090757 A1 Apr. 15, 2010

(51) Int. Cl.
*H03B 1/00* (2006.01)
*H03K 5/00* (2006.01)
*H04B 1/10* (2006.01)

(52) U.S. Cl. ........................................ 327/554; 327/553
(58) Field of Classification Search ........... 327/552–554
See application file for complete search history.

(56) References Cited

U.S. PATENT DOCUMENTS

| 6,452,444 | B1 * | 9/2002 | Mehr | 327/554 |
| 7,113,029 | B2 * | 9/2006 | Hsieh et al. | 327/553 |
| 7,646,235 | B2 * | 1/2010 | Christ | 327/543 |

* cited by examiner

*Primary Examiner* — Lincoln Donovan
*Assistant Examiner* — Diana J Cheng
(74) *Attorney, Agent, or Firm* — John J. Patti; Wade J. Brady, III; Frederick J. Telecky, Jr.

(57) ABSTRACT

An active RC filter (20) includes a first resistive element (23) and a first capacitor array (10/50) which co-acts with the first resistive element (23) to determine a bandwidth characteristic of the programmable active RC filter circuit (20). The total filter capacitance is programmed by switching various first capacitors (4-0, 1, 2 . . . 7) of a first capacitor array (10) in parallel between first and second terminals of the first capacitor array in response to a control word (B0, 1, 2 . . . 7) to determine a first portion of the bandwidth characteristic, and by switching various second capacitors (7-0, 1, 2 . . . 6) of the first capacitor array between the first and second terminals of the first capacitor array in parallel with various ones of the first capacitors (4-0, 1, 2 . . . 7) of the first capacitor array (10) in response to less significant bits (B0, 1, 2 . . . 6) of the control word (B0, 1, 2 . . . 7) to determine a second portion of the bandwidth characteristic.

12 Claims, 7 Drawing Sheets

CIRCUIT AND METHOD FOR IMPROVED FREQUENCY RESOLUTION OF WIDE-BANDWIDTH DIGITALLY PROGRAMMABLE RC ACTIVE FILTERS

BACKGROUND OF THE INVENTION

The present invention relates generally to programmable active filter stage circuits, and more particularly to a technique which increases the resolution of the bandwidth of a digitally programmable filter stage with respect to a bandwidth control word.

FIG. 1 shows a wide-bandwidth digitally programmable capacitor array 1 suitable for use in a RC active filter stage. Programmable capacitor array 1 has its terminals connected to conductors 2 and 3, respectively. The bits B7,B6,B5,B4, B3,B2,B1,B0 of a 8-bit control word are applied to the gates of N-channel switching transistors M7, M6, M5, M4, M3, M2, M1, and M0, respectively. The sources of transistors M7, M6, M5, M4, M3, M2, M1, and M0 are connected to conductor 3. The drains of transistors M7, M6, M5, M4, M3, M2, M1, and M0 are connected to first terminals of filter capacitors 4-7, 4-6, 4-5, 4-4, 4-3, 4-2, 4-1, and 4-0, respectively. Second terminals of those filter capacitors are connected to conductor 2. One terminal of a capacitor 6 of capacitance $C_{FIX}$ is connected to conductor 2 and the other terminal is connected to conductor 3. The capacitances of filter capacitors 4-0, 1, 2 . . . 7 are equal to C0, 2C0, 4C0, 8C0, 16C0, 32C0, 64C0 and 128C0, respectively. The binary exponential weighting of the foregoing filter capacitors as indicated by the numbers 1, 2, 4, 8 . . . 128 as shown along conductor 2 in FIG. 1. The capacitance $C_{FIX}$ is selected to establish a maximum bandwidth of a digital filter stage including capacitor array 1.

In digitally programmable wide-bandwidth RC active filter design, the filter bandwidth BW (or corner frequency Fc, usually specified at the 1 dB or 3 dB point) is usually adjusted by controlling the amount of capacitance C through the use of a bank or array of capacitors. Each capacitor is connected in series with a corresponding switch (usually a MOS transistor). Turning the switch on/off, the capacitor is added/removed to/from the equivalent RC network, varying the filter corner frequency Fc~1/RC. In a conventional implementation, the capacitor array is usually composed of a defined number N of capacitors, in series with corresponding switches, the capacitors being binarily weighted by the factors 1, 2, 4, 8, 16, . . . $2^{N-1}$, respectively. The combination of those binary weighted capacitors provides a total capacitance that is a linear function of the control word or state programmed into the RC active filter, usually through a serial interface or calibration logic circuit.

Referring to curve A in the graph of subsequently described FIG. 3A, it shows that bandwidth points corresponding to successive binary steps are close together for low bandwidths and far apart for high bandwidths, due to the parabolic nature of the relationship between bandwidth and the capacitance of an RC filter. For example, on curve A a one-bit change in the binary control word B7,B6,B5,B4,B3,B2,B1,B0 changes the filter bandwidth from about 22 MHz to about 18 MHz. This very large change in bandwidth BW means that the bandwidth resolution with respect to the control word B7,B6,B5, B4,B3,B2,B1,B0 is very low for a programmable filter stage which includes programmable capacitor array 1.

However, in many applications it is highly desirable to keep the bandwidth resolution of a digital filter within a certain percentage, specific to the particular application, of the maximum bandwidth resolution value so that the filter bandwidth can be controlled with a desired level of accuracy. Consequently, it is also highly desirable that the bandwidth of a digital filter be as linear as possible with respect to the value of the digital bandwidth control word. Unfortunately, the relationship of the bandwidth of a RC circuit to the capacitance thereof is parabolic, i.e., the bandwidth is proportional to 1/C. Therefore, the desired linear relationship of the bandwidth of the digital filter to the value of the digital bandwidth control word is relatively difficult and impractical to achieve.

Because of the 1/C dependence of the filter bandwidth on the filter capacitance value, the filter bandwidth shows a parabolic behavior, with very small steps in bandwidth at large filter capacitance values (and consequently low bandwidth values) and very wide steps in bandwidth at low filter capacitance values (and consequently high bandwidth values). That is, the filter bandwidth has fine resolution with respect to the binary control word at low bandwidths and gross resolution with respect to the binary control word at high bandwidths.

This problem is more severe in filter design if a wide range of frequencies is required for the filter bandwidth. The problem could be minimized by increasing the number of control bits and consequently the number of capacitor "bit units" in the capacitor array, but this would reduce the frequency step sizes at high bandwidths at the expense of an even smaller frequency step sizes at low bandwidth and also at the expense of additional circuit complexity.

It is believed that increasing the number of binary control bits is the main known technique for increasing the bandwidth resolution of programmable active RC filters in the prior art. It would be highly desirable to provide a way of improving the bandwidth resolution of a programmable active RC filter without increasing the number of control bits to achieve a more uniform control of the bandwidth.

Thus, there is an unmet need for a way to provide a substantially lower percentage change in bandwidth of a programmable active RC filter for each binary step of the filter bandwidth control word than has been achievable in the prior art.

SUMMARY OF THE INVENTION

It is a primary object of the present invention to provide a substantially lower percentage change in bandwidth of a programmable active RC filter for each binary step of the filter bandwidth control word than has been achievable in the prior art.

Briefly described, and in accordance with one embodiment, the present invention provides an active RC filter (20) includes a first resistive element (23) and a first capacitor array (10/50) which co-acts with the first resistive element (23) to determine a bandwidth characteristic of the programmable active RC filter circuit (20). The total filter capacitance is programmed by switching various first capacitors (4-0, 1, 2 . . . 7) of a first capacitor array (10) in parallel between first and second terminals of the first capacitor array in response to a control word (B0, 1, 2 . . . 7) to determine a first portion of the bandwidth characteristic, and by switching various second capacitors (7-0, 1, 2 . . . 6) of the first capacitor array between the first and second terminals of the first capacitor array in parallel with various ones of the first capacitors (4-0, 1, 2 . . . 7) of the first capacitor array (10) in response to less significant bits (B0, 1, 2 . . . 6) of the control word (B0, 1, 2 . . . 7) to determine a second portion of the bandwidth characteristic.

In one embodiment, the invention provides a programmable active RC filter circuit (20) including a first circuit-performance-determining element (23) and a first array of circuit elements (10) having a first terminal (2) and a second terminal (3), wherein the first array of circuit elements (10) co-acts with the first circuit-performance-determining element (23) to determine a circuit performance characteristic of the programmable active RC filter circuit (20). The first array of circuit elements (10) is programmable in response to a binary control word (B0, 1, 2 . . . 7) to determine the circuit performance characteristic. The first array of circuit elements (10) includes a plurality of first circuit elements (4-0, 1, 2 . . . 7) each having a first terminal coupled to the first terminal (2) of the first array of circuit elements (10) and a plurality of first switches (M0a, M1a . . . M6a, M7) each having a first terminal coupled to a second terminal of a corresponding first circuit element (4-0, 1, 2 . . . 6), respectively. The plurality of first switches (M0a, M1a . . . M6a, M7) each has a second terminal coupled to the second terminal (3) of the first array of circuit elements (10). The first array of circuit elements (10) also includes a plurality of second circuit elements (7-0, 1, 2 . . . 6) each having a first terminal coupled to the first terminal (2) of the first array of circuit elements (10) and a plurality of second switches (M0b, M1b, M2b . . . M6b) each having a first terminal coupled to a second terminal of a corresponding second circuit element (7-0, 1, 2 . . . 6), respectively. The plurality of second switches (M0b, M1b, M2b . . . M6b) each has a second terminal coupled to the second terminal (3) of the first array of circuit elements (10). Control terminals of the plurality of first switches (M0a, M1a . . . M6a, M7) are coupled to receive corresponding bits, respectively, of the binary control word (B0, 1, 2 . . . 7) to determine a first portion (Band 1) of the circuit performance characteristic and to contribute to determination of a second portion (Band 2) of the circuit performance characteristic. Logic circuitry (12-0, 1, 2 . . . 6) is coupled to receive the binary control word (B0, 1, 2 . . . 7) for gating a plurality of less significant bits (B0, 1, 2 . . . 6) of the binary control word (B0, 1, 2 . . . 7) to control terminals of corresponding second switches, respectively, (M0b, M1b, M2b . . . M6b) only when a more significant bit (B7) of the binary control word (B0, 1, 2 . . . 7) is at a "1" level, to contribute to the determination of the second portion (Band 2) of the circuit performance characteristic.

In a described embodiment, first circuit-performance-determining element is a first resistive element (23), the first array of circuit elements is a first capacitor array (10) which includes a plurality of first capacitors (4-0, 1, 2 . . . 7) which are binarily weighted, and the second array of circuit elements includes a plurality of second capacitors (7-0, 1, 2 . . . 6) which are binarily weighted. The logic circuitry (12-0, 1, 2 . . . 6) operates to gate the plurality of less significant bits (B0, 1, 2 . . . 6) by means of the more significant bit (B7) of the binary control word (B0, 1, 2 . . . 7). The more significant bit (B7) controls a more significant one (M7) of the first switches (M0a, M1a . . . M6a, M7) to couple a corresponding more significant one (4-7) of the first capacitors (4-0, 1, 2 . . . 7) between the first (2) and second (3) terminals of the programmable active RC filter circuit at a beginning of the second portion (Band 2) of the bandwidth characteristic. A maximum-bandwidth-determining capacitor (6) is coupled between the first terminal (2) and the second terminal (3) of the programmable active RC filter circuit and has a value of capacitance which determines a maximum bandwidth of the programmable active RC filter circuit (20).

In a described embodiment, the logic circuitry (12-0, 1, 2 . . . 6) includes a plurality of ANDing circuits (12-0, 1, 2 . . . 6) which receive the plurality of less significant bits (B0, 1, 2 . . . 6) of the binary control word (B0, 1, 2 . . . 7), respectively, and which also receive the more significant bit (B7).

In a described embodiment, the plurality of first switches (M0a, M1a . . . M6a, M7) includes a plurality of transistors, respectively, and the plurality of second switches (M0b, M1b, M2b . . . M6b) includes a plurality of transistors, respectively.

In a described embodiment, the programmable active RC filter circuit (20) includes the first capacitor array (10/50) and an operational amplifier (31) having a first input (+) resistively coupled to a first input signal (Vin$^+$), a second input (−) resistively coupled to a second input signal (Vin$^-$). The first input signal (Vin$^+$) is resistively coupled to the first terminal (2) of the first capacitor array (10/50). The second input signal (Vin$^-$) is resistively coupled to the second terminal (3) of the first capacitor array (10/50), a first feedback resistor (27) coupled between the first input (+) and a first output (+) of the operational amplifier (31). A second feedback resistor (28) is coupled between the second input (−) and a second output (−) of the operational amplifier (31). A second capacitor array (32) is coupled between the first input (+) and the first output (+) of the operational amplifier (31), and a third capacitive array (33) is coupled between the second input (−) and the second output (−) of the operational amplifier (31).

In a described embodiment, the first portion (Band 1) of the bandwidth characteristic corresponds to half of the contiguous binary states of the binary control word (B0, 1, 2 . . . 7) and the second portion (Band 2) corresponds to the other half of the contiguous binary states of the binary control word (B0, 1, 2 . . . 7). In another described embodiment, the first portion (Band 1) of the bandwidth characteristic corresponds to less than half of the contiguous binary states of the binary control word (B0, 1, 2 . . . 7) and the second portion (Band 2) corresponds to less than half of the contiguous binary states of the binary control word (B0, 1, 2 . . . 7). In one embodiment, the first capacitor array (50) includes a plurality of third capacitors (7-2, 8-2 . . . 9-2) each having a first terminal coupled to the first terminal (2) of the first capacitor array (50) and a plurality of third switches (M0-2, M1-2 . . . M5-2) each having a first terminal coupled to a second terminal of a corresponding third capacitor (7-2, 8-2 . . . 9-2), respectively. The plurality of third switches (M0-2, M1-2 . . . M5-2) each has a second terminal coupled to the second terminal (3) of the first capacitor array (50). The logic circuitry (51) is coupled to receive the binary control word (B0, 1, 2 . . . 7) for gating a plurality of less significant bits (B02, B12 . . . B52) to control terminals of corresponding third switches (M0-2, M1-2 . . . M5-2) only when two more significant bits (B7,B6) are at logic levels so as to contribute to the determinations of a third portion (Band 3) and a fourth portion (Band 4) of the bandwidth characteristic.

In one embodiment, the invention provides a method for improving the resolution of a programmable active RC filter circuit (20), including providing a first resistive element (23) and a first capacitor array (10/50) which co-acts with the first resistive element (23) to determine a bandwidth characteristic of the programmable active RC filter circuit (20), and programming a total filter capacitance of the RC filter circuit (20) by switching various first capacitors (4-0, 1, 2 . . . 7) of a first capacitor array (10/50) in parallel between first (2) and second (3) terminals of the first capacitor array (10/50) in response to a binary control word (B0, 1, 2 . . . 7) to determine a first portion (Band 1) of the bandwidth characteristic, and switching various second capacitors (7-0, 1, 2 . . . 6) of the first capacitor array (10) between the first (2) and second (3) terminals of the first capacitor array (10) in parallel with various ones of the first capacitors (4-0, 1, 2 . . . 7) of the first capacitor array (10) in response to a plurality of less significant bits (B0, 1, 2 . . . 6) of the binary control word (B0, 1, 2 . . . 7) to determine a second portion (Band 2) of the bandwidth characteristic. In one embodiment, the method includes controlling a plurality of first switches (M0a, M1a ... M6a, M7) each connected to couple a corresponding one of the first capacitors (4-0, 1, 2 ... 6), respectively, between the first (2) and second (3) terminals of the first capacitor array (10) in response to the binary control word (B0, 1, 2 ... 7), and the method also includes controlling a plurality of second switches (M0b, M1b, M2b ... M6b) each connected to couple a corresponding one of the second capacitors (7-0, 1, 2 ... 6), respectively, between the first (2) and second (3) terminals of the first capacitor array (10) in response to the plurality of less significant bits (B0, 1, 2 ... 6) of the binary control word (B0, 1, 2 ... 7). In one embodiment, the method includes switching the various second capacitors (7-0, 1, 2 ... 6) of the first capacitor array (10) between the first (2) and second (3) terminals of the first capacitor array (10) in parallel with various ones of the first capacitors (4-0, 1, 2 ... 7) of the first capacitor array (10) in response to the plurality of less significant bits (B0, 1, 2 ... 6) of the binary control word (B0, 1, 2 ... 7) to determine a second portion (Band 2) of the bandwidth characteristic only when a more significant bit (B7) is at a "1" level to contribute to the determination of the second portion (Band 2) of the bandwidth characteristic. In the described method, the capacitances of the plurality of the first capacitors (4-0, 1, 2 ... 7) are binarily weighted and the capacitances of the plurality of second capacitors (7-0, 1, 2 ... 6) are binarily weighted.

In one embodiment, the method includes including controlling a more significant bit (B7) of the binary control word to couple a corresponding more significant one (4-7) of the first capacitors (4-0, 1, 2 ... 7) between the first (2) and second (3) terminals of the programmable active RC filter circuit at a beginning of the second portion (Band 2) of the bandwidth characteristic.

In one embodiment, the invention provides a programmable active RC filter circuit (20) including a first resistive element (23) and a first capacitor array (10/50) which co-acts with the first resistive element (23) to determine a bandwidth characteristic of the programmable active RC filter circuit (20), and means for programming a total filter capacitance of the programmable active RC filter circuit (20) by switching various first capacitors (4-0, 1, 2 ... 7) of a first capacitor array (10/50) in parallel between first (2) and second (3) terminals of the first capacitor array (10/50) in response to a binary control word (B0, 1, 2 ... 7) to determine a first portion (Band 1) of the bandwidth characteristic, and switching various second capacitors (7-0, 1, 2 ... 6) of the first capacitor array (10) between the first (2) and second (3) terminals of the first capacitor array (10) in parallel with various ones of the first capacitors (4-0, 1, 2 ... 7) of the first capacitor array (10) in response to a plurality of less significant bits (B0, 1, 2 ... 6) of the binary control word (B0, 1, 2 ... 7) to determine a second portion (Band 2) of the bandwidth characteristic.

DETAILED DESCRIPTION OF THE PREFERRED EMBODIMENTS

The design technique of the present invention provides a solution to the problem of low resolution of the filter bandwidth (with respect to a binary bandwidth control word) at high bandwidths for any kind of filter design wherein the signal frequency control is achieved by means of a programmable capacitor array and/or a programmable resistor array. The embodiments of the invention described hereinafter focus mainly on programmable capacitor array implementations of programmable active RC filters. By separating the required range for the filter bandwidth into a number of consecutive "bands" of predetermined amplitude by means of accurate re-adjusting of each "bit unit" in the capacitor array for each individual band, approximately linear relation of the filter bandwidth to the value of the bandwidth control word can be achieved to, thereby produce a relatively constant percentage of the ratio between filter bandwidth and the maximum bandwidth of the filter for a particular value of the binary bandwidth control word.

Figure 1:
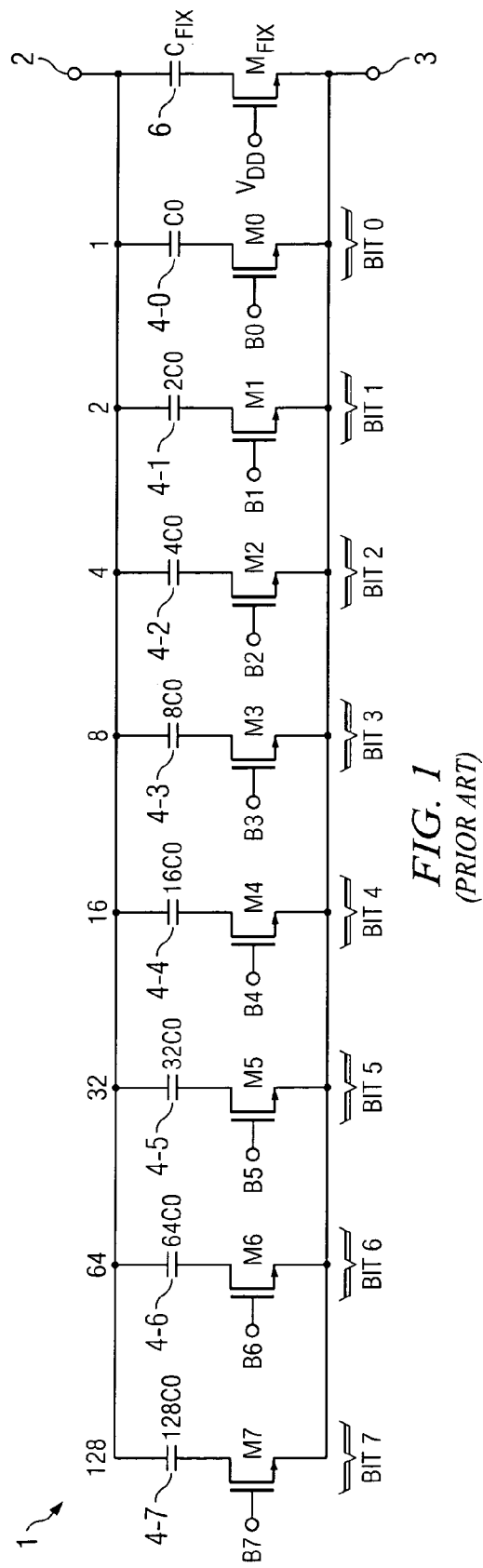
FIG. 1 is a schematic diagram of a conventional programmable capacitor array of a digital programmable active RC filter.

The above described capacitor array 1 of Prior Art FIG. 1 is referred to here in as a "1-band" programmable capacitor array because every "scan" in a programmable active RC filter including programmable capacitor array 1 wherein control word B7,B6,B5,B4,B3,B2,B1,B0 sequentially assumes its 256 states, from all 0's to all 1's produces a single parabolic curve of bandwidth versus binary control word value corresponding to the single set of capacitors in programmable capacitor array 1. (By way of definition, the term "programming" herein refers to applying values of the binary bandwidth control word B7,B6,B5,B4,B3,B2,B1,B0 which are not necessarily in order of increasing or decreasing value, whereas the term "scanning" refers to applying successive values of the binary control word in increasing or decreasing LSB (least significant bit) increments.)

Figure 2:
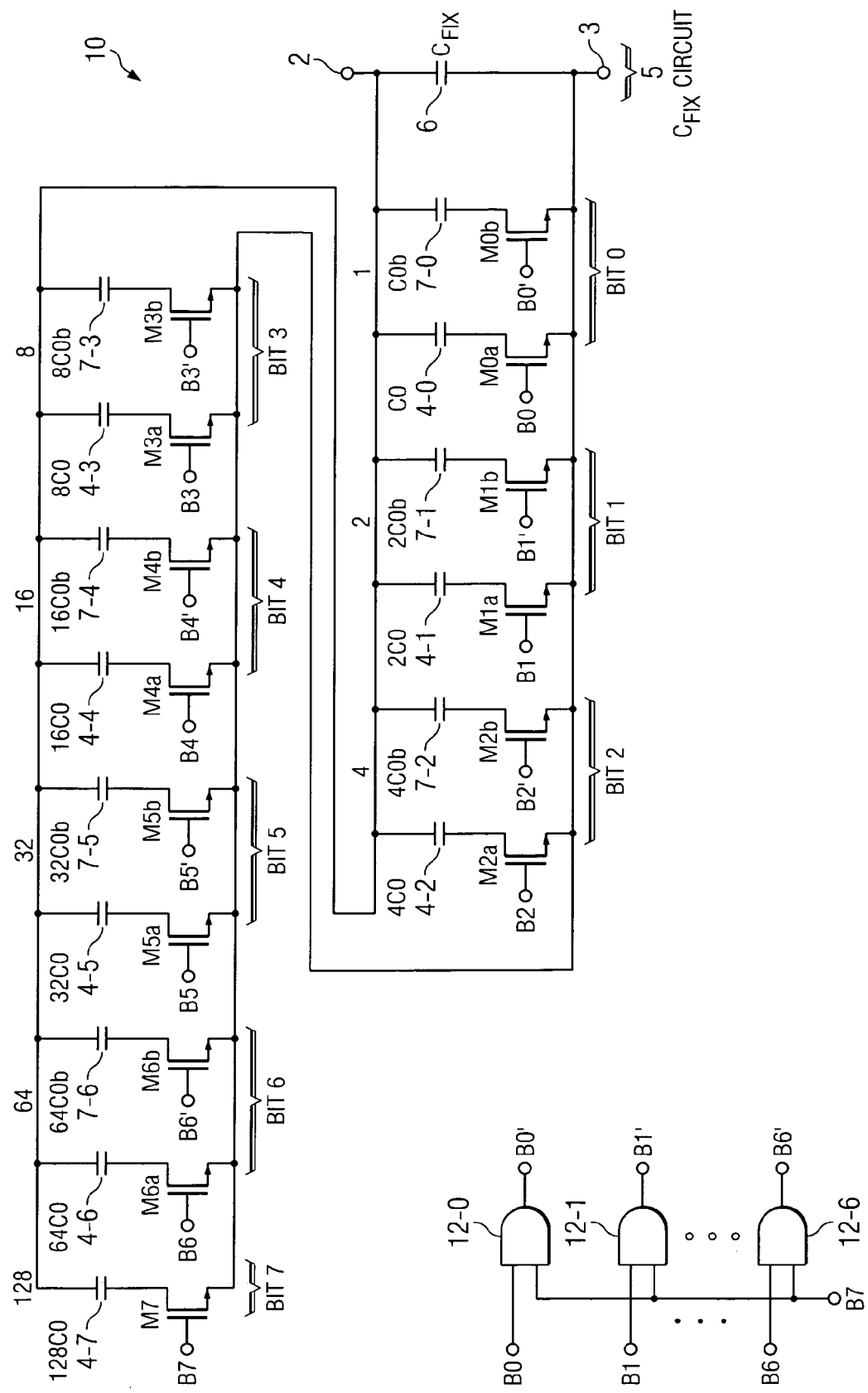
FIG. 2 is a schematic diagram of a "2-band" programmable capacitor array of a high resolution digital programmable active RC filter, including a logic circuit for scanning/programming the bandwidth of a programmable RC filter, in accordance with the present invention.

FIG. 2 shows a "2-band" programmable wide-bandwidth digitally programmable capacitor array suitable for use in a programmable RC active filter stage, for example as shown in subsequently described FIG. 4A. Programmable capacitor array 10 has its terminals connected to conductors 2 and 3, respectively. The bits B7,B6,B5,B4,B3,B2,B1,B0 of a 8-bit control word are applied to the gates of N-channel switching transistors M7, M6a, M5a, M4a, M3a, M2a, M1a, and M0a, respectively. The sources of these transistors are connected to conductor 3. The drains of transistors M7, M6a, M5a, M4a, M3a, M2a, M1a, and M0a are connected to first terminals of filter capacitors 4-7, 4-6, 4-5, 4-4, 4-3, 4-2, 4-1, and 4-0, respectively. Second terminals of those filter capacitors are connected to conductor 2.

Bit signals B6, B5, B4, B3, B2, B1, and B0 are applied to one input of AND gates 12-0, 1 . . . 6. Bit B7 is applied to the other input of each of AND gates 12-0, 1 . . . 6. The outputs of AND gates 12-0, 1 . . . 6 produce bit signals B0', B1', B2' . . . B6', respectively. When B7 is a "0", bit signals B0', B1', B2' . . . B6' are all 0's, and when B7 is a "1", B0', B1', B2' . . . B6' are equal to B0, B1, B2 . . . B6, respectively. (By way of definition, the term "ANDing circuit" as used in the claims is intended to encompass any circuit which performs a logical AND function, including an AND gate, a NAND gate, and also OR and NOR gates which perform a logical ANDing function according to De Morgan's theorem.)

Bit signals B0', B1', B2' . . . B6' are applied to the gates of N-channel switching transistors M0b, M1b, M2b . . . M6b, respectively. The sources of transistors M0b, M1b, M2b . . . M6b are connected to conductor 3. The drains of transistors M0b, M1b, M2b . . . M6b are connected to first terminals of filter capacitors 7-0, 7-1, 7-2 . . . 7-6, respectively. The second terminals of filter capacitors 7-0, 7-1, 7-2 . . . 7-6 are connected to conductor 2. Bit B7 is applied to the gate of a N-channel transistor M7 having its source connected to conductor 3 and its drain connected to one terminal of a capacitor 4-7, the other terminal of which is connected to conductor 2. The capacitances of filter capacitors 4-0, 1, . . . 7 are the same as in 1-band programmable capacitor array 1 of Prior Art FIG. 1. That is, the capacitances of filter capacitors 4-0, 1, 2 . . . 7 are equal to C0, 2C0, 4C0, 8C0, 16C0, 32C0, 64C0 and 128C0, respectively. The capacitances of filter capacitors 7-0, 1,2,3,4,5,6,7 are equal to C0b, 2C0b, 4C0b, 8C0b, 16C0b, 32C0b, and 64C0b, respectively.

One terminal of a capacitor 6 of capacitance $C_{FIX}$ is connected to conductor 2 and the other terminal of capacitor 6 is connected to conductor 3. The binary exponential weighting of the foregoing filter capacitors is indicated by the numbers 1, 2, 4, 8 . . . 128 as they are positioned along conductor 2 in FIG. 1. The capacitance $C_{FIX}$ is selected to establish a maximum bandwidth of a digital filter stage including capacitor array 1. (As a first order approximation, the maximum bandwidth BWmax is approximately equal to $1/(RC_{FIX})$, and the minimum bandwidth BWmin is approximately equal to $1/R(C_{FIX}+255*C0)$ in a standard binary implementation where R is the equivalent resistance seen by the capacitor array.)

C0 sets a minimum value of the total capacitance of array 10 and hence sets a maximum value of the bandwidth of a programmable active RC filter which includes array 10 (for example the programmable active RC filter shown in subsequently described FIG. 4A). The value C0 of capacitor 4-0 is a starting capacitance value which is exponentially stepped up or increased as "Band 1 scanning" of capacitor array 10 progresses, i.e., as B0, 1 . . . 6 progresses from all 0's to all 1's with B7 equal to 0, where C0 is the step value. In the case of an N-bit scanning word, $C0=(Cmax-Cmin)/2^{N-1}$, where Cmax and Cmin are determined according to the desired values of BWmin and BWmax and $Cmin=C_{FIX}$. The maximum filter capacitance of capacitor array 10 is $C_{FIX}$ 127*C0 (because $1*2^6+1*2^5+1*2^3+1*2^2+1*2^1+1*2^0$ is equal to 127).

At the end of the Band 1 scanning, B0, 1 . . . 6 goes from all 1's to all 0's, and B7 goes from 0 to 1. this adds the capacitance 128*C0 of filter capacitor 4-7 to $C_{FIX}$, so the exponential increase pattern of the total filter capacitance continues as "Band 2 scanning" begins, and B0, 1 . . . 6 is incremented up to all 1's again. Note that using the 2-band approach results in the maximum capacitance being $Cmax=C_{FIX}+128*C0+127*C01$, with C01 being different from C0, whereas using the 1-band approach results in $Cmax=C_{FIX}+255*C0$.

The BIT 7 (i.e., bit unit 7) capacitance 128C0 is needed to provide continuity in the curve of bandwidth versus the value of the binary bandwidth control word when bits B01, 2 . . . 6 change from all 1's at which the total filter capacitance is equal to 127C0, to all 0's with all of the filter capacitors switched out except for the capacitance corresponding to BIT B7 and transistor M7. Therefore, the total filter capacitance of 128C0 provided by BIT 7 is needed to maintain continuity of the curve of bandwidth versus the binary control word.

To summarize, as the bandwidth control word B0, 1 . . . 7 scans through its values from all 0's to all 1's the total filter capacitances add up from an initial value of $C_{FIX}$ to $C_{FIX}$ plus 127C0. When bit 7 switches from a 0 to a 1, the next value of the total filter capacitance needed is $C_{FIX}$ plus 128C0, when bits B0, 1 . . . 6 return to 0. When B7 in FIG. 2B is 0, then the outputs of all of the AND gates 12-0, 1 . . . 6 will be 0, and only the "Band 1 capacitors" are switched to generate the "Band 1" section of the curve of bandwidth versus binary control word value. The Band 2 capacitors in parallel with the Band 1 capacitors are switched to create the Band 2 portion of the curve of bandwidth versus binary control word value. (Note that if $C_{FIX}$ is not present, then the filter including capacitor array 10 of FIG. 2 no longer functions as a filter if all bits of the binary control word are 0's, because under these conditions the filter capacitance is zero.)

Figure 3A:
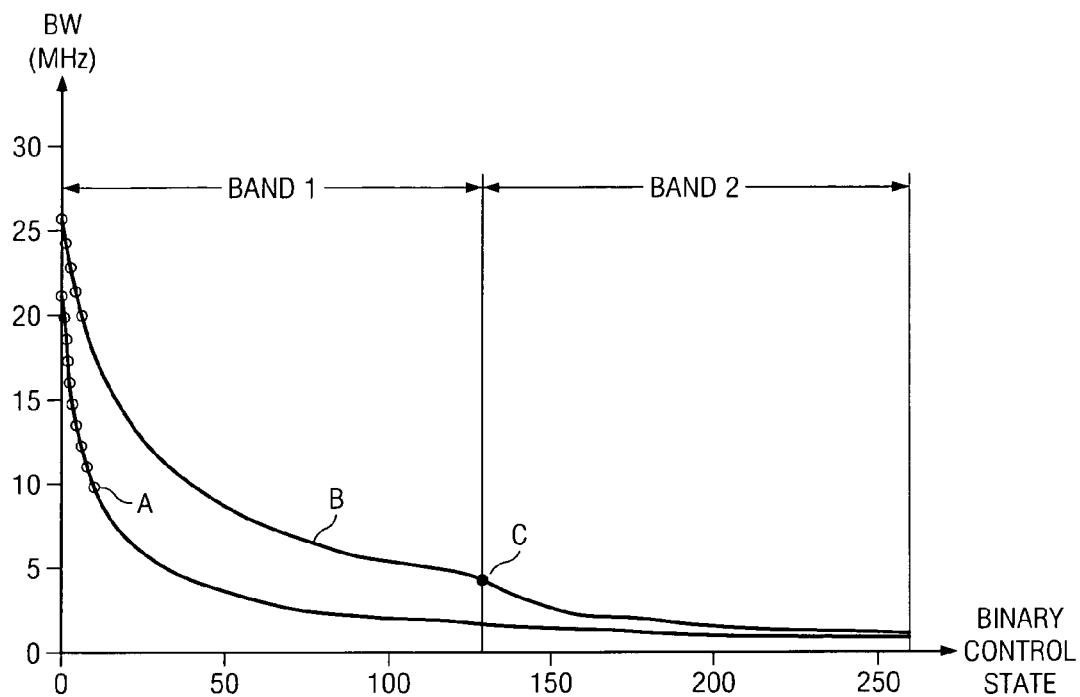
FIG. 3A is a graph showing bandwidth as a function of a binary control word for the conventional programmable RC filter of FIG. 1 and the programmable RC filter of FIG. 2.
Figure 3B:
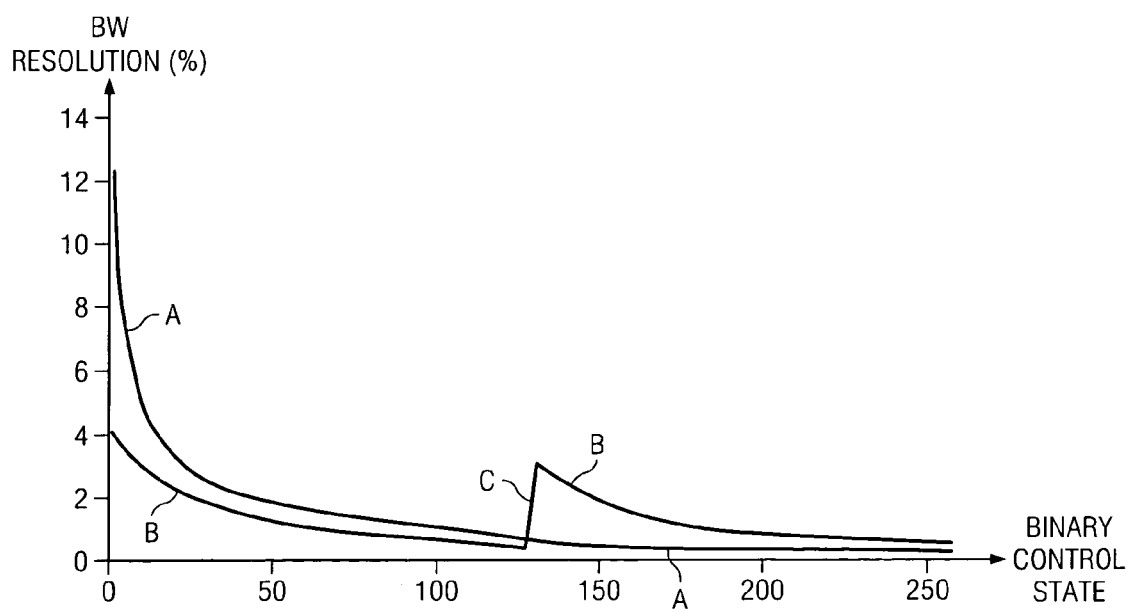
FIG. 3B is a graph showing bandwidth resolution as a function of a binary control word for the conventional programmable RC filter of FIG. 1 and the programmable RC filter of FIG. 2.

Previously described curve A in FIG. 3A shows the filter bandwidth for a "single-band" programmable active RC filter (as in FIG. 4A) including capacitor array 1 of Prior Art FIG. 1. Curve B shows the filter bandwidth for a 2-band programmable active RC filter including capacitor array 10 of FIG. 2, wherein point C occurs when the binary control word is 128. "Band 1" refers to the portion of curve B which occurs during the above-mentioned "Band 1 scanning", and "Band 2" refers to the portion of curve B which occurs during the above mentioned "Band 2 scanning". FIG. 3B shows essentially the same thing as FIG. 3A, but the distance of the various points on curve B in FIG. 3B from each other is expressed as Bandwidth Resolution, wherein the bandwidth at each point of the curve B is expressed as a percentage of the maximum bandwidth. (For example, if the binary control word is programmed to a certain value which results in a total capacitance Cx and a bandwidth BWx, and if then the binary control word is incremented/decremented one bit up/down, this results in a total capacitance variation Cx±C0 that causes a corresponding bandwidth variation±ΔBW. The bandwidth resolution in percent in that region of the Bandwidth Resolution curve is then (ΔBW/BWx)*100.)

It should be noted that curve B in FIG. 3B appears more linear than the corresponding curve B in FIG. 3A. Ideally, curve B should be as linear as possible. FIG. 3A represents Bandwidth versus the binary control word, while FIG. 3B represents Bandwidth resolution (in %) versus the binary control word. FIG. 3A shows that a similar frequency range is covered with both the Curve A and Curve B approaches, while FIG. 3B shows that at higher bandwidth the frequency resolution is improved. Even though the error has increased close to the binary control word state 128 (transition C in FIG. 3B), this is not necessarily problematic.

The embodiment of FIG. 2 has 2 bands, but the invention may be implemented using more than 2 bands. Ideally, a linear (i.e., straight line) bandwidth or bandwidth resolution characteristic would be most desirable. But on the average, the error will be lower and lower as the number of bands is increased. How many bands are chosen is a trade-off between circuit complexity and the amount of bandwidth resolution that is needed. The more scanning "bands" a capacitor array is divided into, the more accurately an active RC filter in accordance with the invention will approximate a linear relationship between the bandwidth and the binary control word.

It should be noted that for a 2-band implementation, only BIT B7 is used to select one of the two bands. However, for more than 2 bands, it is necessary to use more than one of the 8 control word bits in order to select a particular one of the bands. For 3 or 4 bands, bits B7 and B6 can be used to select the band to be scanned. In this case, bit signals B5, 4 . . . 0 will be used in the same way as in the capacitor array 10 of FIG. 2 to select the total array capacitance and hence the filter bandwidth. For example, incrementing bit signals B5 through bit B0 sequentially from all 0's to all 1's determines Band 1, and then the states of bit signals B7 and B6 would go from 00 to 01. That would select Band 2, and then the appropriate transition capacitance to be entered in parallel with $C_{FIX}$ would be switched in and the "Band 2 scanning" would be started, with bit signals B5 through B0 counting sequentially from all 0's to all 1's to define Band 2. At that point, bit signals B7 and B6 would go from 01 to 10, and another appropriate transition capacitance would be switched in parallel with $C_{FIX}$ capacitance to provide continuity in the curve of the bandwidth characteristic from Band 2 to Band 3. The foregoing process would be repeated for bit signals B7 and B6 assuming the state 11 and switching in yet another appropriate transition capacitance in parallel with $C_{FIX}$ capacitance to provide continuity in the curve of bandwidth versus binary control word from Band 3 to Band 4.

The number of capacitances in each "bit unit" BIT 0, 1 . . . 7 is equal to the number of bands selected for the capacitance array design. In every case, an appropriate transition capacitance must be switched in parallel with $C_{FIX}$ at the end of the scanning (or programming) which defines the end of a particular band before performing the scanning (or programming) which defines the next band.

In Band 1 of FIG. 3A, the values of the first 6 signals B0-B1, . . . B6 of the binary control word are incremented from all 0's to all 1's i.e., from 0 up to 127 to the point C of curve B. Bit signal B7 then is switched from a 1 to a 0. Then the values of the first 6 signals B0-B1, . . . B6 of the binary control word again are incremented from all 0's to all 1's i.e., from 128 up to 255, which in effect repeats a portion of curve A to form the Band 2 portion of curve B in FIG. 3. In FIG. 3B, the same information is expressed as a percentage of the maximum bandwidth of the active RC filter implemented by means of capacitor array 10 of FIG. 4. The number of peaks in the FIG. 3B curve is equal to the number of bands, but the average error will be lower as a number of bands is increased.

Figure 4A:
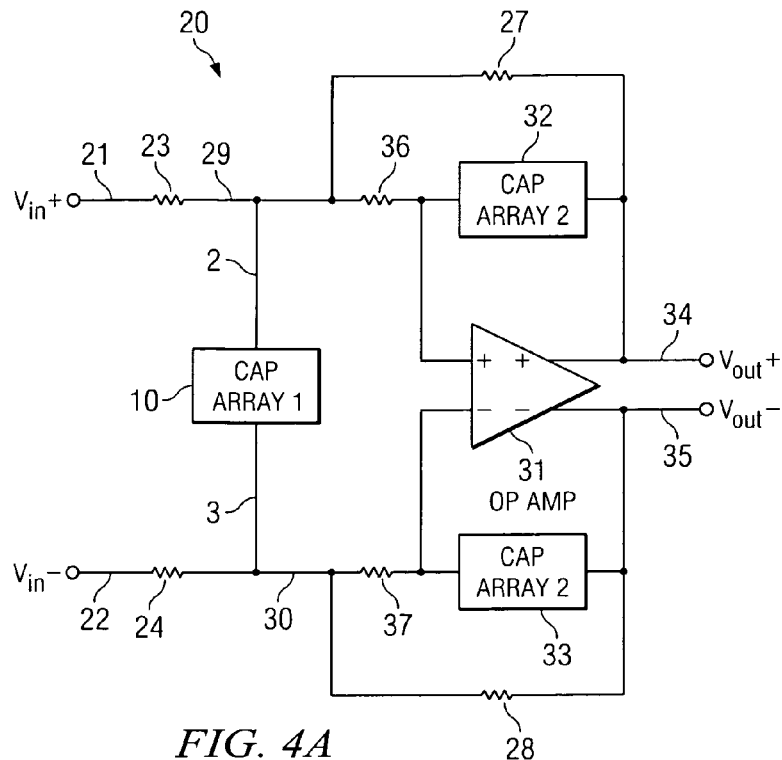
FIG. 4A is a diagram of a programmable RC filter stage including the programmable capacitor array of FIG. 2.
Figure 4B:
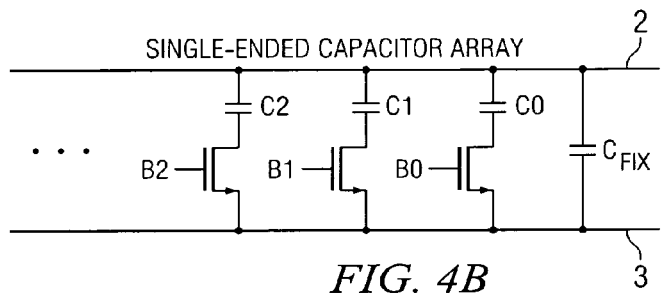
FIGS. 4B and 4C are simplified diagrams to illustrate a single-ended programmable capacitor array and a differential programmable capacitor array, respectively.
Figure 4C:
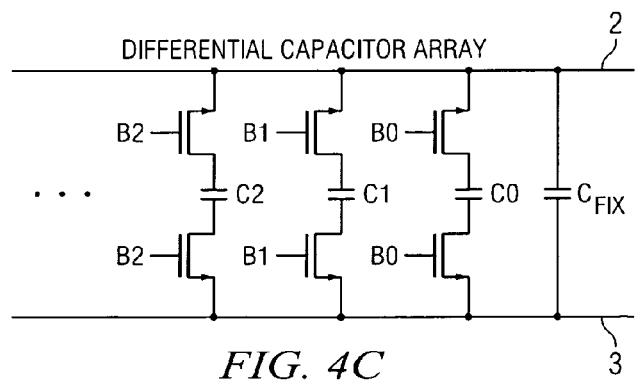

Referring to FIG. 4A, a second order filter stage 20 receives a differential input voltage Vin$^+$–Vin$^-$ applied between input terminals 21 and 22, which are connected to first terminals of input resistors 23 and 24. The other terminals of input resistors 23 and 24 are connected to conductors 29 and 30. Conductors 29 and 30 are coupled by gain resistors 36 and 37, respectively, to the (+) and (−) inputs of operational amplifier 31. A programmable capacitor array 10, which can be the one shown in FIG. 2 or the one shown in FIG. 7, has its terminals (terminals 2 and 3 in FIG. 2) connected to conductors 29 and 30, respectively. Conductor 29 also is connected to the first terminal of a feedback resistor 27, which can be a programmable resistor array. The other terminal of feedback resistor 27 is connected by conductor 34 to the (+) output of operational amplifier 31. Similarly, conductor 30 also is connected to the first terminal of a feedback resistor 28, which can be a programmable resistor array. The other terminal of feedback resistor 28 is connected by conductor 35 to the (−) output of operational amplifier 31, which produces a differential output signal Vout$^+$–Vout$^-$ between conductors 34 and 35. A differential capacitor array 32 quite similar to single-ended capacitor array 10 is connected between conductor 34 and to the (+) input of operational amplifier 31, and a differential capacitor array 33 identical to differential capacitor array 32 is connected between conductor 35 and to the (−) input of operational amplifier 31. (An example of what is meant by "single-ended capacitor array" is illustrated by the simplified diagram in FIG. 4B, wherein only one plate of each capacitor is connected to a switching transistor. An example of what is meant by "differential capacitor array" is illustrated by the simplified diagram in FIG. 4C, wherein switching transistors are connected to both plates of the capacitors.)

FIG. 4A shows a possible implementation (e.g., a multi-feedback topology implementation) of a $2^{nd}$ order programmable active RC filter stage 20, which can be a 1-band, 2-band . . . etc. filter stage, depending on the size of the "bit units" in the programmable capacitor array. Programmable active RC filter stage 20 can be used in a wide variety of filters. For example, it can be used to implement a $8^{th}$ order Butterworth Low Pass Filter by simply cascading 4 RC filter stages 20 connected in series. The number of stages in a particular implementation depends on the order of the filter and what kind of filter is required for the particular application to meet a particular specification for the amount of signal rejection desired. Each filter stage 20 would have different parameters, such as different resistor values and different capacitor values. (For example, in a 4-stage $8^{th}$ order Butterworth filter (which has a maximally flat frequency response), each stage being a second order stage having two poles for each, the two poles need to be placed in a particular position in order to obtain the desired filter transfer characteristic or frequency response. This means the resistor and capacitor values of each stage 20 have to be different in order to provide the needed positions for the various poles) The same concept applies to first order RC filter stages or the any possible implementation of a single stage for higher order RC active filters.

Figure 5:
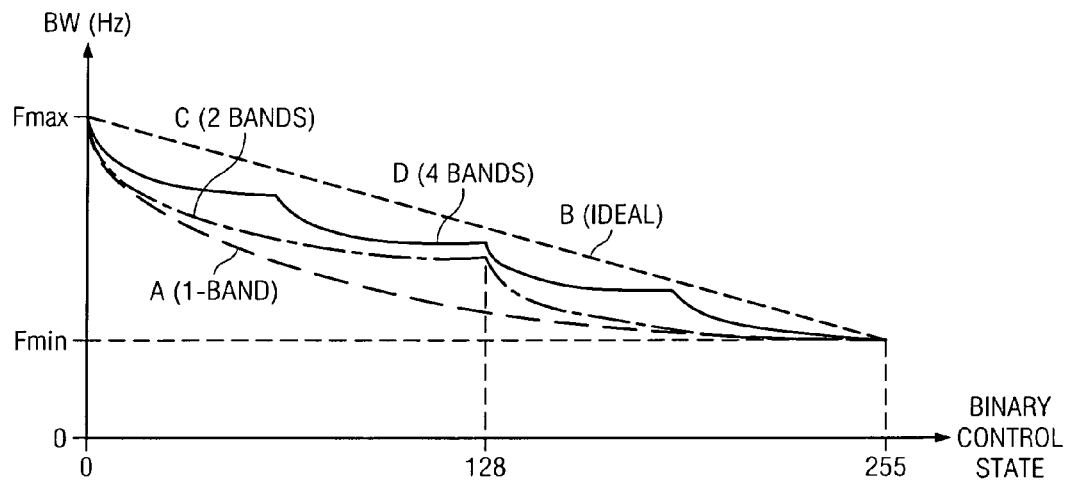
FIG. 5 is a graph showing curves of bandwidth versus a binary control word for programmable active RC filters including programmable capacitor arrays which include 1 band as in the prior art, and 2 bands and 4 bands according to the present invention, respectively.

FIG. 5 shows a graph of the bandwidth of a filter stage 20, such as the one shown in FIG. 4A, versus the value of the 8-bit binary control word. Ideally, maximum resolution of the bandwidth with respect to the binary control word would be linear, as indicated by straight line B in FIG. 5. For a filter stage 20 implemented by means of capacitor array 1 of Prior Art FIG. 1, curve A in FIG. 5 indicates the parabolic relationship of filter stage bandwidth as a function of the binary control word. As mentioned previously, a filter stage 20 using capacitor array 1 of Prior Art FIG. 1 can be thought of as a 1-Band filter stage.

If filter stage 20 of FIG. 4A is implemented using the 2-band capacitor array 10 of FIG. 2, the filter stage bandwidth as a function of the binary control word is indicated by curve C in FIG. 5. The "2-band" curve C is a closer approximation to the ideal linear curve B than the "1-Band" curve A. A "4-band" curve can be generated by filter stage 20 implemented by means of the 4-Band capacitor array 50 shown in subsequently described FIG. 7, and is shown by curve D in FIG. 5. The 4-Band curve D clearly is a closer approximation to the ideal linear curve B than the 2-band curve C.

Figure 6:
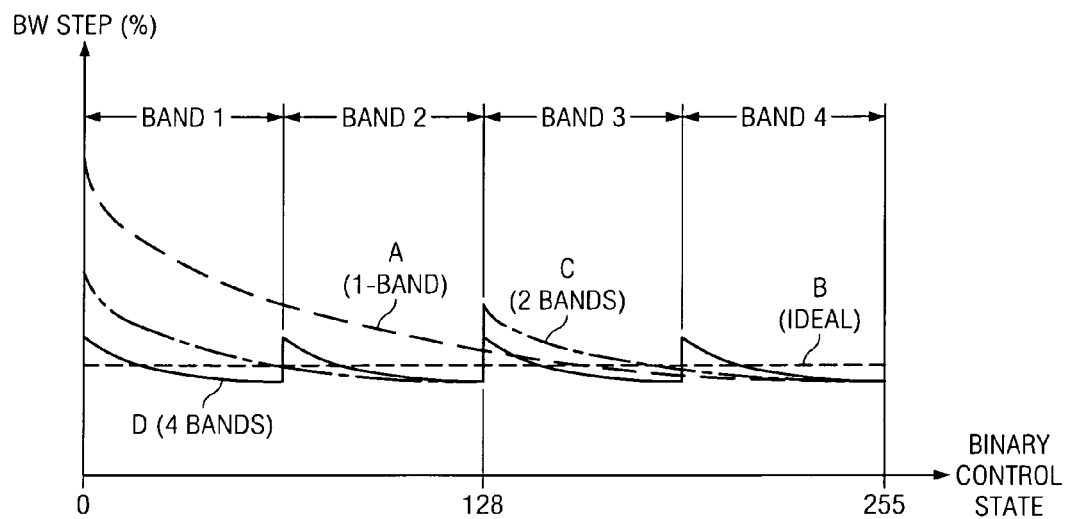
FIG. 6 is a graph showing curves of bandwidth resolution versus a binary control word for programmable active RC filters including programmable capacitor arrays which include 1 band as in the prior art, and 2 bands and 4 bands according to the present invention, respectively.

FIG. 6 is a graph which corresponds to the graph of FIG. 5 except that the bandwidth resolutions (i.e., the bandwidth step size expressed in Curves A, B, C and D as percentages of the corresponding maximum bandwidths for the corresponding curves in FIG. 5) are plotted as functions of the binary control word. The 4-band curve D in FIG. 6 obviously is a much better approximation to the ideal linear curve B then either the 1-band curve A of the prior art or the 2-band curve C for a filter stage using the two-band capacitor array 10 of FIG. 2.

Thus, the present invention improves the frequency/bandwidth resolution at higher bandwidths without increasing the number of bits in the binary control word. This results in an improvement of the frequency resolution at high bandwidth where the improvement is needed, with negligible degradation of the frequency resolution at lower bandwidth where it was initially high. The present invention also maintains continuity of the bandwidth characteristic, i.e., the bandwidth programmability. Furthermore, the invention also maintains a monotonic relation between bandwidths and the binary control word, i.e., the filter bandwidth always decreases when the binary control word values are consecutively increased. This feature is very important if a calibration algorithm is implemented. (Note that there are other options that could be used to improve the frequency resolution using the same number of bits, but those options have other problems. For example, the bands might not be continuous or might overlap, or in other cases there might be states that are repeated in the sense that a particular value of the binary control word might correspond to more than one frequency.)

Figure 7:
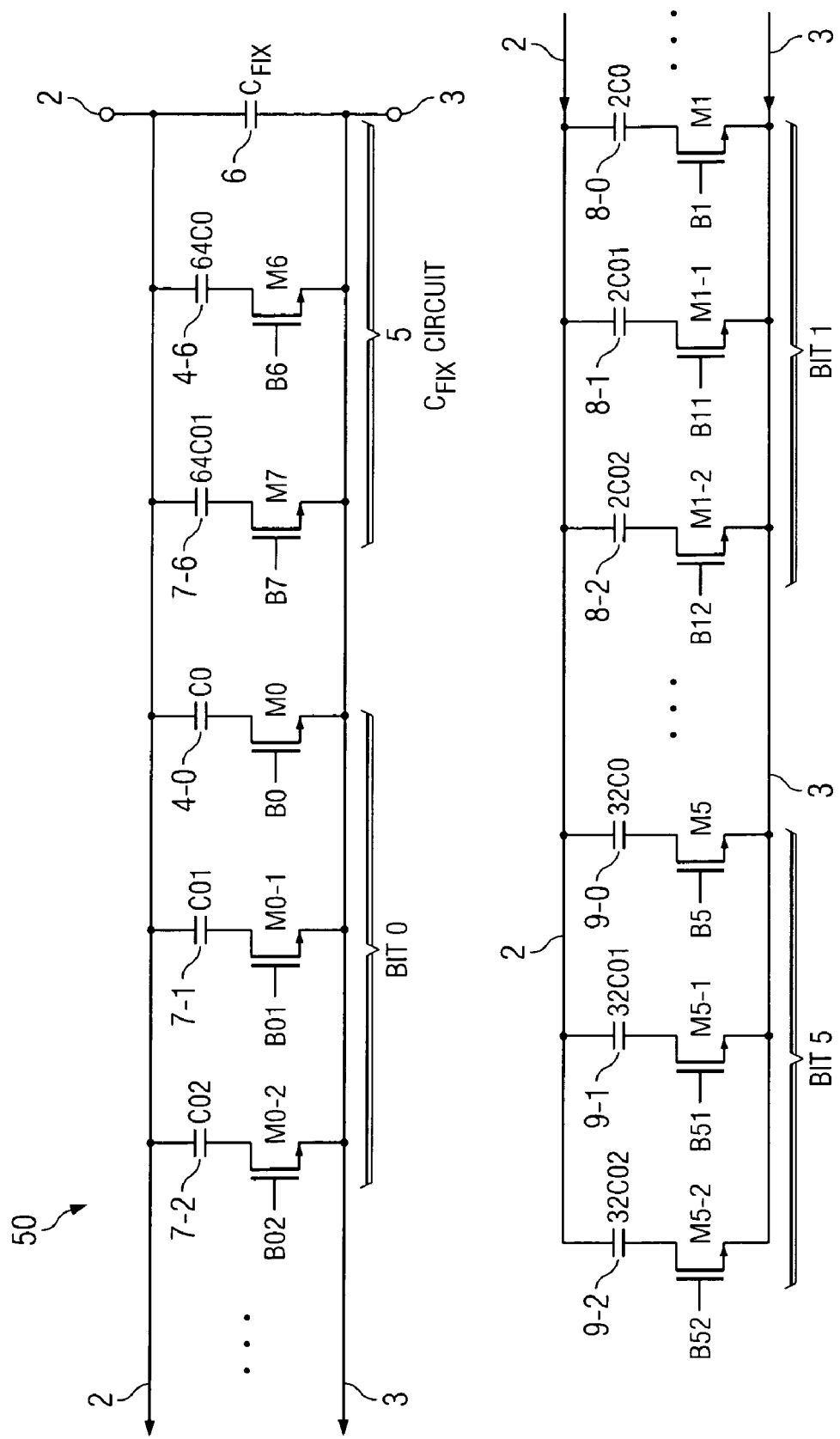
FIG. 7 is a schematic diagram of a digitally programmable capacitor array having 4 bands in accordance with the present invention.

FIG. 7 shows a "4-band" capacitor array 50 which may be used instead of 2-band array 10 of FIG. 2 to provide the input capacitor array 10 in FIG. 4A. A differential version of 4-band capacitor array 50 of FIG. 7 can be used for capacitor arrays 32 and 33 in filter stage 20 of FIG. 4A. As mentioned above, the "4-Band" curves D in FIGS. 5 and 6 would be generated by filter stage 20 in this case. In FIG. 7, $C_{FIX}$ circuit 5 includes capacitor 6 of capacitance $C_{FIX}$, capacitor 4-6 of capacitance 64C0, and capacitor 7-6 of capacitance 64C01. Switching transistors M7 and M6 have their sources connected to conductor 3 and their drains connected to the lower terminals of capacitors 7-6 and 4-6, respectively. The upper terminals of capacitors 7-6 and 4-6 are connected to conductor 2. Bit signals B7 and B6 are applied to the gates of transistors M7 and M6, respectively.

BIT 0 includes capacitors 4-0, 7-1 and 7-2 having their upper terminals connected to conductor 2. Switching transistors M0, M0-1 and M0-2 have their drains connected to a lower terminals of capacitors 4-0, 7-1 and 7-2, respectively, and their sources connected to conductor 3. Bit signals B0, B01 and B02 are applied to the gates of transistors M0, M0-1 and M0-2, respectively. Similarly, BIT 1 includes capacitors 8-0, 8-1 and 8-2 having their upper terminals connected to conductor 2. Switching transistors M1, M1-1 and M1-2 have their drains connected to a lower terminals of capacitors 8-0, 8-1 and 8-2, respectively, and their sources connected to conductor 3. Bit signals B1, B11 and B12 are applied to the gates of transistors M1, M1-1 and M1-2, respectively. Similarly, BIT 5 includes capacitors 9-0, 9-1 and 9-2 having their upper terminals connected to conductor 2. Switching transistors M5, M5-1 and M5-2 have their drains connected to a lower terminals of capacitors 9-0, 9-1 and 9-2, respectively, and their sources connected to conductor 3. Bit signals B5, B51 and B52 are applied to the gates of transistors M5, M5-1 and M5-2, respectively.

The capacitances of capacitors 4-0, 7-1 and 7-2 are C0, C01 and C02, respectively. The capacitances of capacitors 8-0, 8-1 and 8-2 are 2C0, 2C01 and 2C02, respectively. The capacitances of capacitors 9-0, 9-1 and 9-2 are 32C0, 32C01 and 32C02, respectively.

The bit signals B01, B11, . . . B51 are generated from B0, B1, . . . B5 and the signal B6 in the first and section of FIG. 6 by means of circuitry that is somewhat similar to the AND gate circuitry 12-0, 1 . . . 5 shown in FIG. 2. The bit signals B02, B12, . . . B52 also are generated from B0, B1, . . . B5 and the signal B7 in the second section of FIG. 6.

Figure 8:
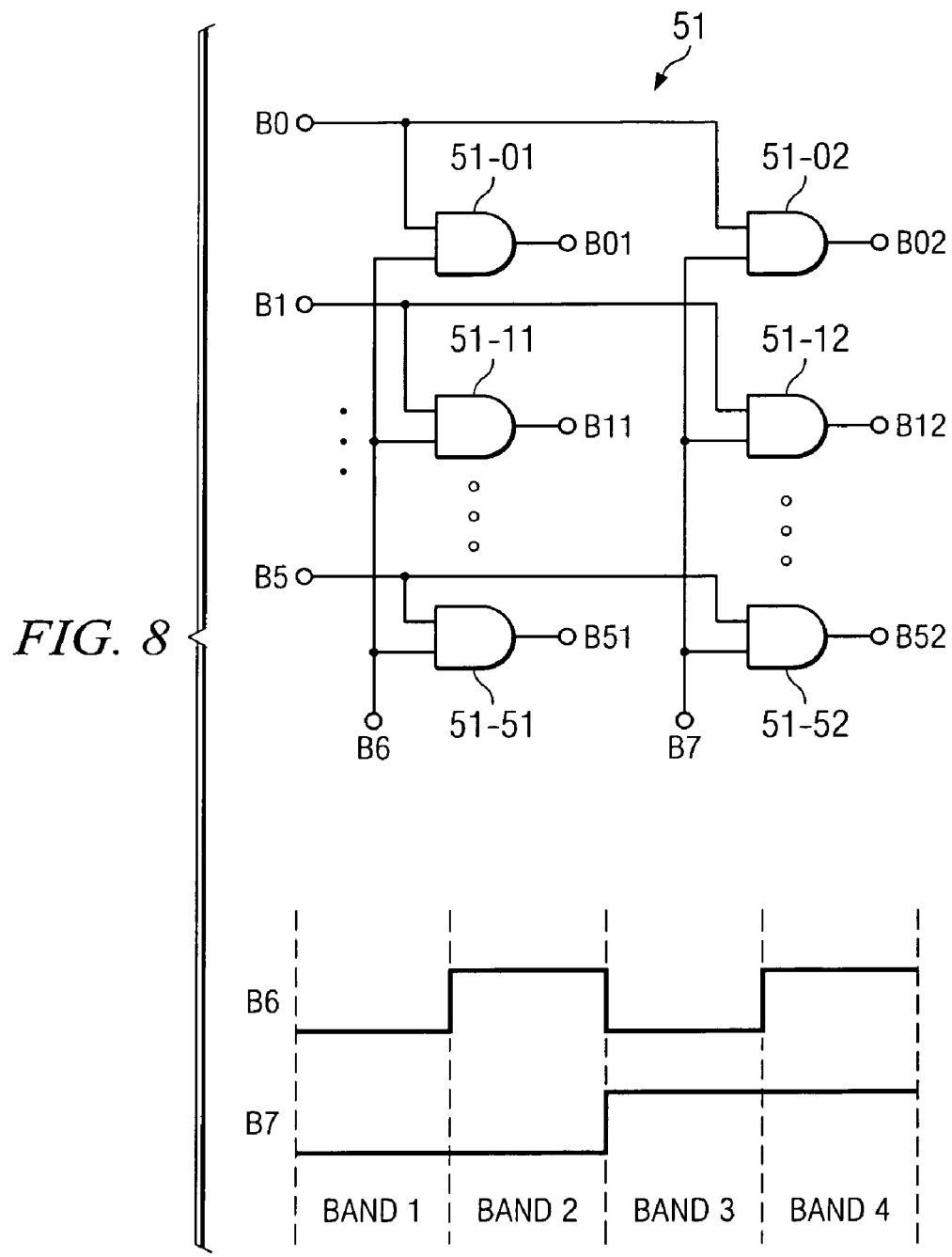
FIG. 8 is a diagram of a logic circuit for scanning/programming the bandwidth of a programmable RC filter including the programmable capacitor array of FIG. 7.

More specifically, FIG. 8 shows a logic circuit 51 which generates the various bit signals required in capacitor array 50 of FIG. 7. The Band 1 section of FIG. 6 is generated in response to bit signals B0, 1 . . . 5. The bit signals B01, B11 . . . B51 required for generation of the Band 2 portion of the bandwidth characteristic are produced by AND gates 51-01, 11 . . . 51 in response to the signal B6 and bit signals B0, 1 . . . 5, respectively. The bit signals B02, B12 . . . B52 required for generation of the Band 3 portion of the bandwidth characteristic are produced by AND gates 51-02, 12 . . . 52 in response to the signal B7 and bits B0, 1 . . . 5, respectively. The combination of the bits B01, B11 . . . B15 and B02, B12 . . . B52 logically ANDed with B7 is required for generation of the Band 4 portion of the bandwidth characteristic. The 4 bands BAND 1, BAND 2, BAND 3, and BAND 4 as a function of the binary control word B0, 1 . . . 7 are also shown FIG. 8. However, those skilled in the art can provide numerous different implementations of the circuitry 51 shown in FIG. 8. Band 1 occurs when B7 and B6 both are equal to 0.

The described embodiments of the invention provide improved bandwidth resolution for programmable active RC filters for a specified number of bandwidth control bits.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the function of the logic circuitry shown in FIGS. 2 and 8 for generating the various bit signals could be accomplished by various other logic circuits.

As another example, the basic idea of the invention can be extended to any other circuit that requires programmably selectable capacitors, resistors, currents, etc., wherein the input/output relation is of the form 1/x and wherein a linear approximation of the 1/x relationship is desired. Although the described embodiments refer to programmable active RC filters in which the bandwidth characteristic is determined by programmable capacitor arrays, in some cases it would be practical to provide such filters wherein the bandwidth characteristic is determined mainly by programmable resistor arrays rather than programmable capacitor arrays. In the described embodiments, resistors 27, 28, 36, and 37 in FIG. 4 can be resistor arrays, the resistances of which are programmable similarly to the way that the described capacitor arrays of FIGS. 2 and 7 are programmable, in order to control the gain of the active RC filter. In this case, some control of the filter bandwidth would be achievable.

In other embodiments, resistor arrays which are programmable by means of switches (similarly to way in which the described capacitor arrays of FIGS. 2 and 7 are programmable) could be utilized in conjunction with fixed capacitors to control the bandwidth of an active RC filter.

What is claimed is:

1. An apparatus comprising:
a resistive element;
a capacitive array having a first terminal and an second terminal, wherein the resistive element is coupled to the first terminal of the capacitive array, and wherein the capacitive array includes:
   a first set of binarily weighted capacitive elements, wherein each capacitive element from the first set of capacitive elements is coupled to the first terminal of the capacitive array;
   a first set of switches, wherein each switch from the first set of switches is associated with at least one of the capacitive elements from the first set of capacitive elements, and wherein each switch is coupled between its capacitive element and the second terminal of the capacitive array, and wherein the first set of switches is controlled by a first binary control word having N bits;
   a second set of binarily weighted capacitive elements, wherein each capacitive element from the second set of capacitive elements is coupled to the first terminal of the capacitive array; and
   a second set of switches, wherein each switch from the second set of switches is associated with at least one of the capacitive elements from the second set of capacitive elements, and wherein each switch is coupled between its capacitive element and the second terminal of the capacitive array, and wherein the second set of switches is controlled by a second control word having N−1 bits; and
logic circuitry having a plurality of AND-gates that are arranged to receive the first binary control word and to generate the second binary control word from the first binary control word, wherein the plurality of AND-gates includes a set of N−1 AND-gates that are each associated with at least one of the switches from the second set of switches and that each receive the Nth bit from the first binary control word.

2. The apparatus of claim 1, wherein the capacitive array further comprises a fixed capacitive circuit that is coupled between the first and second terminals of the capacitive array.

3. The apparatus of claim 2, wherein the fixed capacitive circuit further comprises a fixed capacitive element that is coupled between the first and second terminals of the capacitive array.

4. The apparatus of claim 2, wherein the capacitive array further comprises:
   a first fixed capacitive element that is coupled between the first and second terminals of the capacitive array;
   a second fixed capacitive element that is coupled to the first terminal of the capacitive array;
   a first fixed capacitive switch that is coupled between the second fixed capacitive element and the second terminal of the capacitive array, wherein the first fixed capacitive switch is controlled by the Nth bit of the first binary control word;
   a third fixed capacitive element that is coupled to the first terminal of the capacitive array; and
   a second fixed capacitive switch that is coupled between the third fixed capacitive element and the second terminal of the capacitive array, wherein the second fixed capacitive switch is controlled by the N−1th bit of the first binary control word.

5. The apparatus of claim 4, wherein the capacitive array further comprises:
   a third set of binarily weighted capacitive elements, wherein each capacitive element from the third set of capacitive elements is coupled to the first terminal of the capacitive array; and
   a third set of switches, wherein each switch from the third set of switches is associated with at least one of the capacitive elements from the third set of capacitive elements, and wherein each switch is coupled between its capacitive element and the second terminal of the capacitive array, and wherein the third set of switches is controlled by a third control word.

6. The apparatus of claim 5, wherein the set of N−1 AND-gate further comprises a first set of AND-gates, and wherein the plurality of AND-gates further comprises:
   the first set of AND-gates, wherein the first set of AND-gates generates the second binary control word from the first bit of the first binary control word to the N−2th bit of the first binary control word; and
   a second set of AND-gates, wherein each AND-gate from the second set of AND-gates receives the N−1th bit of the first binary control word, and wherein the second set of AND-gates generates the third binary control word from the first bit of the first binary control word to the N−2th bit of the first binary control word.

7. An apparatus comprising:
an amplifier having a first input terminal and a second input terminal;
a first resistive element is coupled to the first input terminal of the amplifier;
a second resistive element that that is coupled to the second input terminal of the amplifier;
a capacitive array having a first terminal and an second terminal, wherein the first terminal of the capacitive array is coupled to the first resistive element, and wherein the second terminal of the capacitive array is coupled to the second resistive element, and wherein the capacitive array includes:
   a first set of binarily weighted capacitive elements, wherein each capacitive element from the first set of capacitive elements is coupled to the first terminal of the capacitive array;
   a first set of switches, wherein each switch from the first set of switches is associated with at least one of the capacitive elements from the first set of capacitive elements, and wherein each switch is coupled between its capacitive element and the second terminal of the capacitive array, and wherein the first set of switches is controlled by a first binary control word having N bits;
   a second set of binarily weighted capacitive elements, wherein each capacitive element from the second set of capacitive elements is coupled to the first terminal of the capacitive array; and
   a second set of switches, wherein each switch from the second set of switches is associated with at least one of the capacitive elements from the second set of capacitive elements, and wherein each switch is coupled between its capacitive element and the second terminal of the capacitive array, and wherein the second set of switches is controlled by a second control word having N−1 bits; and
logic circuitry having a plurality of AND-gates that are arranged to receive the first binary control word and to generate the second binary control word from the first binary control word, wherein the plurality of AND-gates includes a set of N−1 AND-gates that are each associated with at least one of the switches from the second set of switches and that each receive the Nth bit from the first binary control word.

8. The apparatus of claim 7, wherein the capacitive array further comprises a fixed capacitive circuit that is coupled between the first and second terminals of the capacitive array.

9. The apparatus of claim 8, wherein the fixed capacitive circuit further comprises a fixed capacitive element that is coupled between the first and second terminals of the capacitive array.

10. The apparatus of claim 8, and wherein the capacitive array further comprises:
- a first fixed capacitive element that is coupled between the first and second terminals of the capacitive array;
- a second fixed capacitive element that is coupled to the first terminal of the capacitive array;
- a first fixed capacitive switch that is coupled between the second fixed capacitive element and the second terminal of the capacitive array, wherein the first fixed capacitive switch is controlled by the Nth bit of the first binary control word;
- a third fixed capacitive element that is coupled to the first terminal of the capacitive array; and
- a second fixed capacitive switch that is coupled between the third fixed capacitive element and the second terminal of the capacitive array, wherein the second fixed capacitive switch is controlled by the N−1th bit of the first binary control word.

11. The apparatus of claim 10, wherein the capacitive array further comprises:
- a third set of binarily weighted capacitive elements, wherein each capacitive element from the third set of capacitive elements is coupled to the first terminal of the capacitive array; and
- a third set of switches, wherein each switch from the third set of switches is associated with at least one of the capacitive elements from the third set of capacitive elements, and wherein each switch is coupled between its capacitive element and the second terminal of the capacitive array, and wherein the third set of switches is controlled by a third control word.

12. The apparatus of claim 11, wherein the set of N−1 AND-gate further comprises a first set of AND-gates, and wherein the plurality of AND-gates further comprises:
- the first set of AND-gates, wherein each AND-gate from the first set of AND-gates receives the Nth bit of the first binary control word, and wherein the first set of AND-gates generates the second binary control word from the first bit of the first binary control word to the N−2th bit of the first binary control word; and
- a second set of AND-gates, wherein each AND-gate from the second set of AND-gates receives the N−1th bit of the first binary control word, and wherein the second first-set of AND-gates generates the third binary control word from the first bit of the first binary control word to the N−2th bit of the first binary control word.

* * * * *